United States Patent
Chevallier et al.

(10) Patent No.: US 11,837,285 B2
(45) Date of Patent: Dec. 5, 2023

(54) BIAS TEMPERATURE INSTABILITY CORRECTION IN MEMORY ARRAYS

(71) Applicant: Applied Materials, Inc., Santa Clara, CA (US)

(72) Inventors: Christophe J. Chevallier, Palo Alto, CA (US); Siddarth Krishnan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 17/408,429

(22) Filed: Aug. 22, 2021

(65) Prior Publication Data
US 2023/0058423 A1 Feb. 23, 2023

(51) Int. Cl.
 *G11C 11/00* (2006.01)
 *G11C 13/00* (2006.01)
 *G11C 11/16* (2006.01)

(52) U.S. Cl.
 CPC ...... *G11C 13/0023* (2013.01); *G11C 11/1653* (2013.01); *G11C 11/1675* (2013.01); *G11C 13/0069* (2013.01); *G11C 2213/79* (2013.01)

(58) Field of Classification Search
 CPC ............ G11C 13/0023; G11C 13/0069; G11C 11/1653; G11C 11/1675
 USPC ....................................................... 365/148
 See application file for complete search history.

(56) References Cited

U.S. PATENT DOCUMENTS

| | | | |
|---|---|---|---|
| 9,697,874 B1* | 7/2017 | Asnaashari | ............ H10B 63/30 |
| 2008/0062740 A1 | 3/2008 | Baek et al. | |
| 2013/0114346 A1 | 5/2013 | Berco | |
| 2014/0219002 A1* | 8/2014 | Lee | ....................... G11C 11/1693 365/158 |
| 2017/0162262 A1 | 6/2017 | Park et al. | |
| 2018/0321913 A1* | 11/2018 | Kozicki | .................. G06F 7/588 |
| 2020/0111528 A1 | 4/2020 | Fantini et al. | |

FOREIGN PATENT DOCUMENTS

| | | |
|---|---|---|
| TW | 201135731 A | 10/2011 |
| TW | 201730753 A | 9/2017 |
| TW | 202044490 A | 12/2020 |

OTHER PUBLICATIONS

International Search Report and Written Opinion dated Nov. 23, 2022 in International Patent Application No. PCT/US2022/040107, 9 pages.

* cited by examiner

*Primary Examiner* — Vu A Le
(74) *Attorney, Agent, or Firm* — Kilpatrick Townsend & Stockton LLP

(57) ABSTRACT

A method of correcting bias temperature instability in memory arrays may include applying a first bias to a memory cell, where the memory cell may include a memory element and a select element, and the first bias may causes a value to be stored in the memory element. The first bias causes a bias temperature instability (BTI) associated with the memory cell to increase. The method may also include applying a second bias to the memory cell, where the second bias may have a polarity that is opposite of the first bias, and the value stored in the memory element remains in the memory element after the second bias is applied. The second bias may also cause the BTI associated with the memory cell to decrease while maintaining any value stored in the memory cell.

18 Claims, 11 Drawing Sheets

BIAS TEMPERATURE INSTABILITY CORRECTION IN MEMORY ARRAYS

TECHNICAL FIELD

This disclosure generally describes memory cells in memory arrays. Specifically, this disclosure describes a method and controller that reduce the effects of bias temperature instability in memory arrays by selectively applying biases having an opposite polarity of the normal set/reset memory signals.

BACKGROUND

Bias temperature instability (BTI) is a type of transistor aging effect that strongly affects the reliability of semiconductor devices. For example, in a metal-oxide-semiconductor field-effect transistor (MOSFET), BTI may result in an increase in the threshold voltage and decrease in the drain current and transconductance of the MOSFET. Over time, BTI may be caused by positive charges becoming trapped in the oxide-semiconductor boundary beneath the transistor gate or surrounding the transistor main terminals, such as the source, drain, gate, etc. Eventually the transistor threshold voltage is affected and circuit operations may fail. After removing the transistor gate voltage, these trapped charges may dissipate over time. However, since most electronics undergo near constant use, natural dissipation over days or hours cannot be relied on to reduce the effects of BTI in high-precision devices.

The problems associated with BTI have become more of an issue as transistor sizes continually shrink. It is believed that the smaller gate area of modern transistors concentrates the effect of these trapped charges that would otherwise be distributed over a larger gate area. On a more macro scale, BTI effects may interfere with reduced operating voltages and clock-gating techniques that are often employed to save power in portable electronics. Neural network applications where memory arrays are used to compute matrix vector multiplications may be of particular concern. Even a small amount of transistor degradation due to BTI can impact the accuracy of the neural network inference taking place. Therefore, improvements in the art or needed.

SUMMARY

In some embodiments, a method of correcting bias temperature instability in memory arrays may include applying a first bias to a first memory cell in a memory array, where the first bias may be applied as part of an operation to store a value in a second memory cell in a memory array, The method may also include applying a second bias to the first memory cell, where the second bias includes a polarity that is opposite of the first bias. Any value stored in the first memory cell may remain in the first memory cell after the second bias is applied.

In some embodiments, a memory array may include a plurality of memory cells. Each of the plurality of memory cells may include a memory element and a select element. The memory array may also include a controller configured to apply first biases to memory cells in the plurality of memory cells to store values in the memory cells, and apply second biases to the memory cells. The second biases may include a polarity that is opposite of the first biases. The values stored in the memory elements may remain in the memory elements after the second biases are applied.

In some embodiments, a method of correcting bias temperature instability in memory arrays may include applying a first bias to a memory cell. The first bias may cause a BTI associated with the memory cell to increase. The method may also include applying a second bias to the memory cell. The second bias may cause the BTI associated with the memory cell to decrease while maintaining any value stored in the memory cell.

In any embodiments, any and all of the following features may be implemented in any combination and without limitation. A magnitude of the second bias may be approximately equal to a magnitude of the first bias. A length of time which the second bias is applied may be approximately equal to a length of time which the first bias is applied, and a magnitude of the second bias may be greater than a magnitude of the first bias, and a length of time which the second bias is applied may be less than a length of time which the first bias is applied. A magnitude of the second bias may be less than a magnitude of the first bias, and a length of time which the second bias is applied may be greater than a length of time which the first bias is applied. Applying the first bias to the first memory cell may include applying a plurality of voltage pulses to the memory cell. Applying the second bias to the first memory cell may include applying a single voltage pulse to the first memory cell, where a length of the single voltage pulse may be approximately equal to a sum of lengths of the plurality of voltage pulses. Applying the first bias may include a SET or a RESET operation for the second memory cell, and applying the second bias need not comprise a SET or a RESET operation for the first memory cell or the second memory cell. The first biases may include SET and/or RESET signals for the memory cells. The first biases may also include a plurality of intermediate states between a SET state and a RESET state in the memory cells. The select element may include a transistor comprising an oxide, and the first biases may cause charge carriers to occupy vacancies in the oxide, thereby causing bias temperature instability (BTI) in the transistor. The second biases may remove the charge carriers from the vacancies in the oxide to correct the BTI in the transistor. The memory element may include a resistive random-access memory (RAM) element, a phase-change memory (PCM) element, or a magnetic RAM (MRAM) element. The select element may include a plurality of transistors. At least one of the second biases may be applied prior to the first biases being applied to preempt a BTI effect caused by the first biases. The memory array may also include a counter that counts a number of times the first biases are applied or a length of time the first biases are applied. The first biases may store weights for a neural network into the memory array. The memory array may include an N×M memory array, and the first biases may include (e.g., (N−1)*(M−1)) SET or RESET operations as a first global operation on the memory array. The second biases may be applied as a second global operation on the memory to compensate for BTI effects caused by the one or more executions of the first global operation, such that the second global operation sets applies the second biases to each of the memory cells in the memory array together.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1:
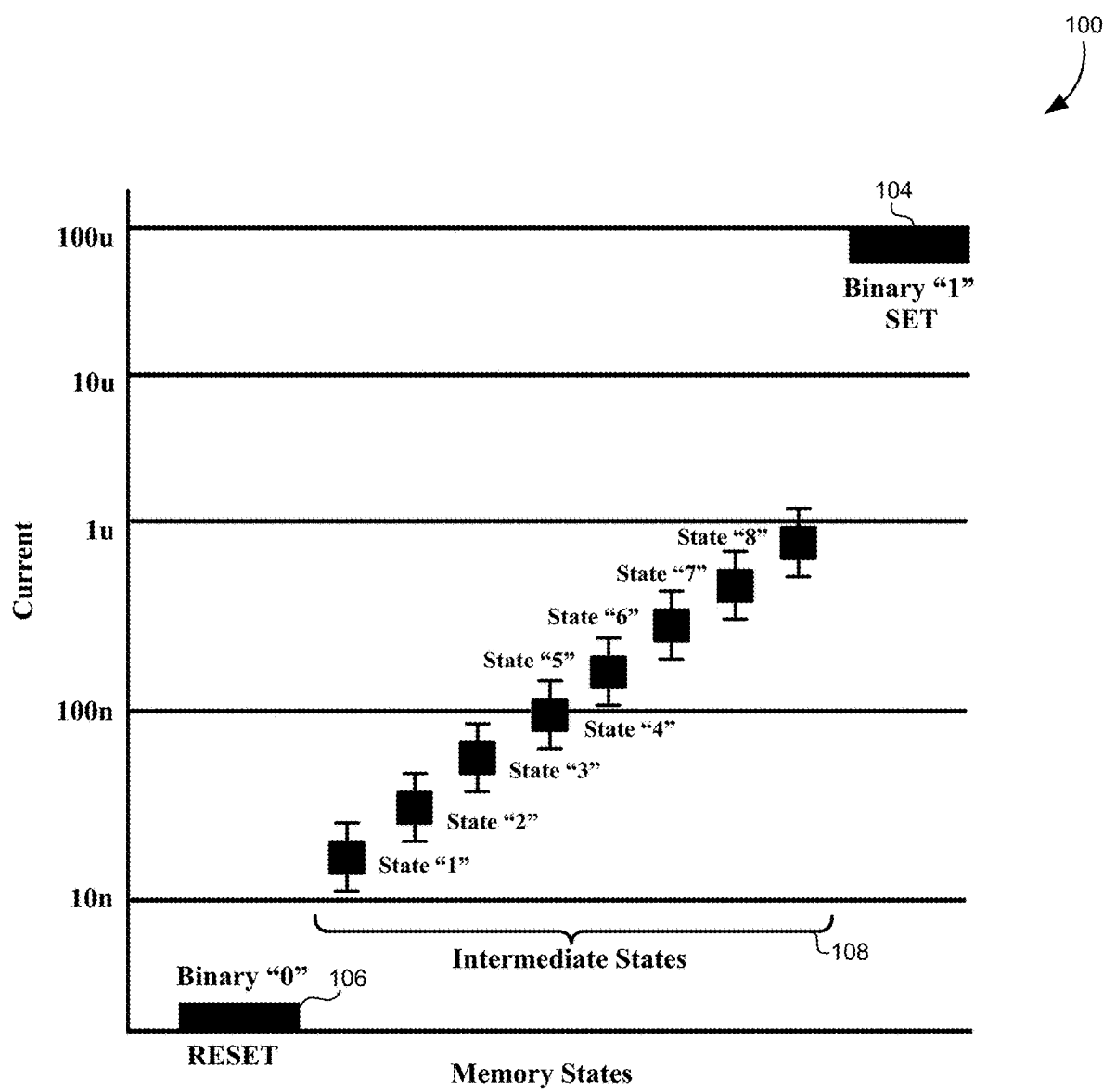
FIG. 1 illustrates a diagram of intermediate states in a memory element, according to some embodiments.

This disclosure describes a technique used to minimize transistor degradation due to bias temperature instability (BTI). BTI is a phenomenon where charges become trapped in a dielectric surrounding the main terminals of a transistor (e.g., the transistor source, drain, gate, bulk, etc.). For example, charges may drift into the oxide interfaces and interstitials of an oxide in a metal-oxide-semiconductor field-effect transistor (MOSFET). These charges may impact the threshold voltage of the transistor. A standard industry practice has been to limit the bias on the transistor so that the transistor maximum threshold voltage stays well under 50 mV. However, as memory elements continue to shrink, and as memory arrays transition from traditional binary memory states into multistate memories (i.e., three or more states), the effects of BTI have become more pronounced. For example, a neural network application using memory arrays to compute complex matrix vector multiplications may suffer a significant loss of accuracy when performing inference operations due to even small transistor degradations from BTI. These memory arrays use emerging non-volatile memories, such as magnetic random-access memory (MRAM) resistive random-access memory (ReRAM), phase-change memory (PCM) and other memory cells that use one or more transistors as select devices.

A method of correcting bias temperature instability in memory arrays may include applying biases having an opposite polarity to reverse the effects of BTI on each memory element. This can be done without disrupting a value stored in the memory element, and need not require current to flow through the memory element. For example, a controller may apply a first bias to a memory cell, where the memory cell may include a memory element and a select element, and the first bias may cause a value to be stored in the memory element (e.g., a SET or RESET signal). The first bias may also cause a bias temperature instability (BTI) associated with the memory cell to increase by causing charges to be trapped in an oxide. To counteract this effect, the controller may apply a second bias to the memory cell, where the second bias may have a polarity that is opposite of the first bias, and the value stored in the memory element remains in the memory element after the second bias is applied. The second bias may cause the BTI associated with the memory cell to decrease while maintaining any value stored in the memory cell by reversing the polarity of the gate voltage without causing the transistor to conduct and select the memory element.

The embodiments used herein are compatible with many different types of memory elements. For example, a ReRAM is a type of nonvolatile random-access memory (RAM) that operates by changing resistance across a dielectric solid-state material. A ReRAM device is often arranged with a control transistor in a 1 transistor-1 resistor (1T1R) memory cell architecture. These memory cells may be used in many different applications, including traditional Von Neumann architectures. A Von Neumann architecture is a computer architecture that includes a processing unit with an arithmetic logic unit and processor registers, a control unit with an instruction register and a program counter, memories that store data and instructions, and/or input/output mechanisms. When a 1T1R memory cell is used in a computer architecture, a filament may be formed between a pair of metal electrodes that causes the memory element to conduct in a relatively high-current state to represent a logic 1 value. This filament may be formed by generating a positive voltage pulse across the drain and source of the transistor. To reset the memory element, a negative voltage pulse may be applied to dissipate the filament and represent a logic 0 value.

While binary memories having two states may be used for traditional Von Neumann architectures, some non-Von Neumann architectures and other applications may benefit from memory cells that can be programmed into a continuum of states between the high-current state and the low-current state. This allows a single memory cell to store a plurality of values in addition to an on/off or 1/0 value (i.e., three or more states).

FIG. 1 illustrates a diagram of intermediate states in a memory element, according to some embodiments. The vertical axis illustrates normalized current through the memory element when in the corresponding state using a logarithmic scale. A single memory element may be set to use traditional binary states comprising a high-current state 104 of greater than 10 μA (e.g., around approximately 100 μA) representing a logic 1. The memory element may also be set to a low-current state 106 of less than 10 nA representing a logic 0. Signals received by a memory cell to enter these states may be generally referred to as set/reset signals. A "set" signal may provide one or more voltage pulses to the memory cell that are sufficient to cause the memory element to enter the high-current state. For example, a set signal may provide a single pulse of sufficient magnitude or a plurality of pulses of a lesser magnitude that cause a filament to form in a ReRAM memory element to fully conduct current and represent a logic 1 in the high-current state 104. Similarly, a "reset" signal may provide one or more voltage pulses to the memory cell that are sufficient to cause the memory element to enter the low-current state 106. For example, a reset signal may provide a single negative pulse of sufficient magnitude or a plurality of negative pulses of a lesser magnitude to cause a filament to be dissipated from a ReRAM device to prevent current conduction sufficient to enter the low-current state.

In addition to the traditional binary states, some embodiments may use memory elements that may be set in a plurality of intermediate states 108 that are between the high-current state 104 and the low-current state 106. A multistate configuration may receive one or more voltage pulses that cause the memory element to enter a current state that is between the high-current state 104 and the low-current state 106. Note that the plurality of intermediate states 108 need not be equally distributed throughout the entire current range of the memory element. This allows the memory element to operate in any of the plurality of intermediate states 108 without drawing a large amount of current. This may be of particular importance in arrays of memory elements, such as crossbar arrays and/or neural networks.

In some embodiments, the memory element may include a metal top electrode and a metal bottom electrode. A voltage may be applied across the metal top electrode and the metal bottom electrode to cause a filament to form between the metal top electrode and the metal bottom electrode. For example, when a positive voltage is applied that is greater than a predetermined "set" voltage for the memory element ($V_{SET}$), a filament may form to bridge an insulating memory layer to electrically connect the metal top electrode to the metal bottom electrode and form a conductive path. Similarly, when a negative voltage is applied that is greater than a predetermined "reset" voltage for the memory element ($V_{RST}$), the filament may be dissipated such that the conductive path is removed or greatly reduced between the metal top electrode and the metal bottom electrode.

Figure 2:
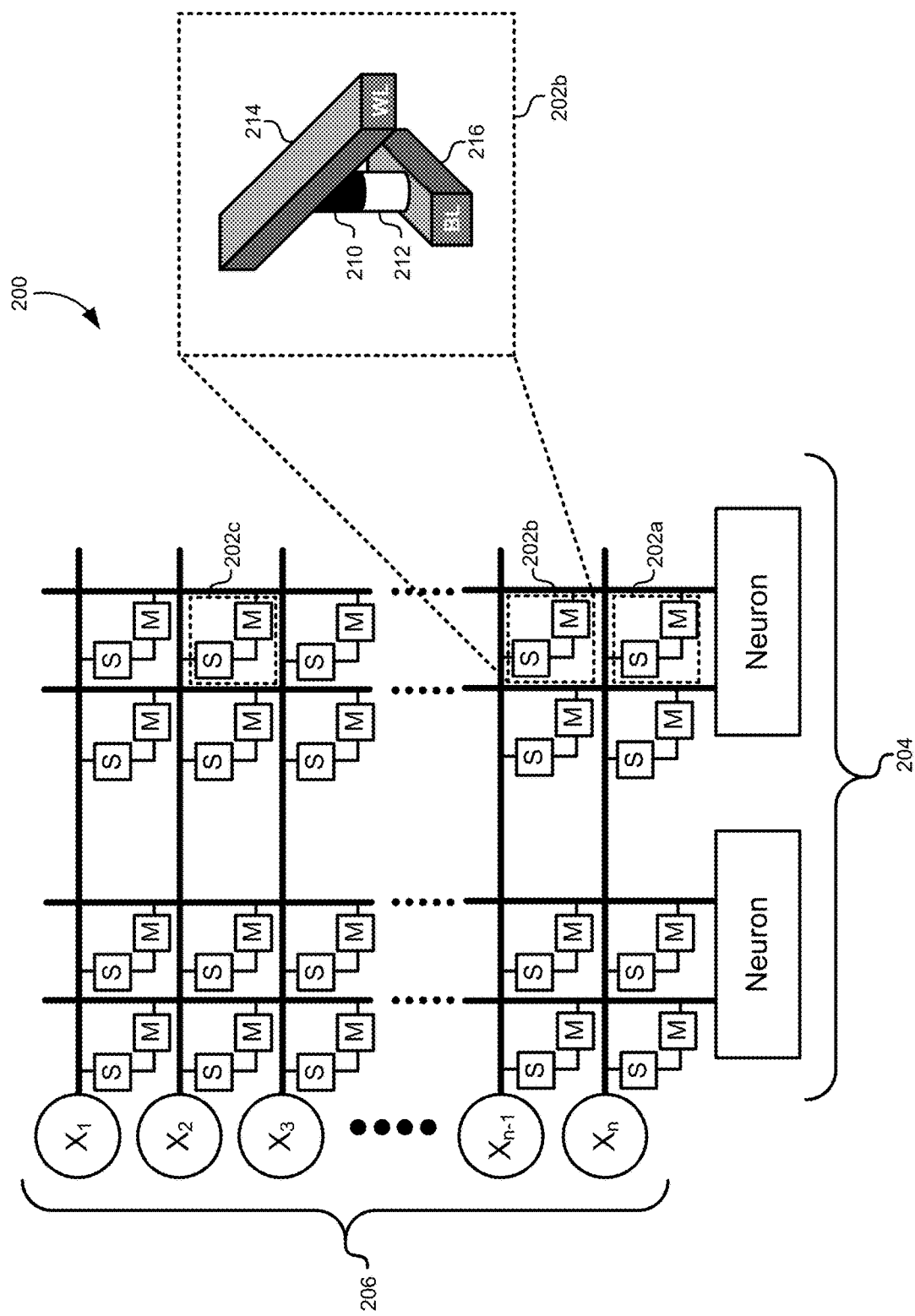
FIG. 2 illustrates a circuit network that implements a neural network, according to some embodiments.

FIG. 2 illustrates a circuit network 200 that implements a neural network, according to some embodiments. FIG. 2 represents a simplified view of a simple neural network where many connections and/or hidden layers may have been omitted for the sake of clearly describing the various circuit components that can be used to represent neurons and synapses. The circuit network 200 includes a plurality of inputs 206 that may be connected to a plurality of devices representing neurons 204 through memory cells 202 representing synapses.

In some embodiments, the synapses may be represented by individual two-terminal memory elements. When using memory devices to model synapses, the circuit network 200 may be viewed as a form of non-volatile memory array. Each of the memory cells 202 representing synapses may be arranged in a rectangular grid pattern. In some embodiments, the grid pattern may be three-dimensional such that multiple grids lie above and below each other, as in a crosspoint memory array. Each of the memory elements may be configured to receive an applied voltage, and based on the polarity of the applied voltage, the memory cells representing the synapses may change a physical state of a material in the memory element to represent a saved logic state, such as a logic 1 and a logic 0. When the voltage is no longer applied, the memory cells 202 may save the logic state induced by the applied voltage, and thus may operate as non-volatile memory elements.

In order to apply the voltage needed to read/write to the memory cells 202, signals may be received from the horizontal lines from the plurality of inputs 206. These horizontal lines may act as a word line in a traditional memory array. The bit lines may run in a perpendicular direction and connect to the output neurons 204. Therefore, applying a voltage between a single one input of the word lines and a single input of the bit lines may cause voltage to be applied across a single one of the memory cells 202 representing synapses. This process can be used to select a single one of the memory cells 202 for a read and/or write operation.

FIG. 2 illustrates a detailed view of a single memory cell 202b. This memory cell 202b uses a word line 214 and a bit line 216 coupled to a select element 210 and a memory element 212. To minimize the leakage current through the circuit network 200, and to isolate memory elements connected on the same word/bit lines, the memory cell 202b may include the select element 210. The select element 210 may be implemented between the memory element 212 and the word line 216. The select element 210 may be used to reduce current from leaking through an individual memory cell 202b and reduce the leakage and power dissipation of the whole array, as well as to prevent disturbances while a memory cell that is passively addressed to access a memory cell on the same bitline/wordline (unless a desired memory cell is selected at a sufficient voltage above the select element threshold received by the memory cell 202b). Therefore, when the voltage is applied to the word line 214 and the bit line 216, the memory cell 202b is accessed while the select elements in memory cell 202a and memory cell 202c may prevent their associated memory elements from being affected by the voltage on the shared bit line 216. Although not shown explicitly in FIG. 2, three-terminal selecting devices may also be used for the select elements, such as transistors, to form a 1T-1 Memory Element cell. Many different technologies may also be used to implement the memory element 212, such as PCMs (Phase Change Memory), oxide-resistive random-access memory (oxR-RAMs) or conductive-bridging memories (CBRAM), ReRAMs, RRAMs, ferroelectric RAMs (FeRAMs), among others.

Figure 3:
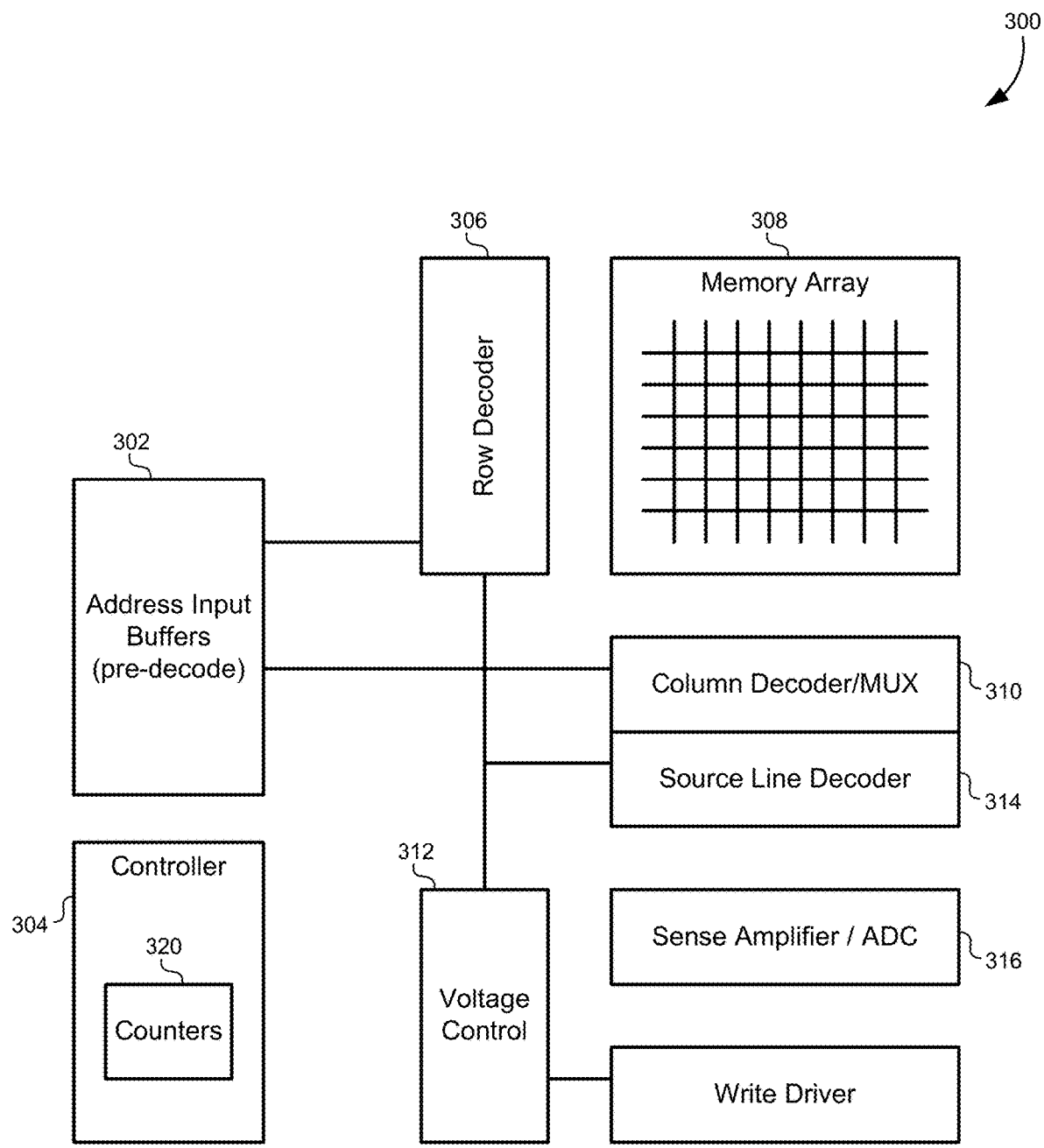
FIG. 3 illustrates a memory system that may be used with different memory array technologies, according to some embodiments.

FIG. 3 illustrates a memory system 300 that may be used with different memory array technologies, according to some embodiments. The memory system 300 may include a memory array 308. The memory array may include a plurality of individual memory cells. For example, the memory cells may be arranged in a crossbar array or other topology that allows memory elements to be read using line addresses. The individual memory cells in the memory array 308 may include any type of memory element and/or any type of select element. The memory array 308 may provide an output to a sense amplifier 316 that will convert a current value to a voltage, which voltage can be input into an analog-to-digital converter (ADC) that is coupled to a sense amplifier 316. The ADC may convert the voltage and/or current signals provided from the memory array 308 into a digital value that may be read by a controller 304. Some embodiments may also include a voltage control 312 that provides regulated voltages to various components in the memory system 300.

The controller 304 may cause values to be written to the memory array 308 and/or read from the memory array 308 by generating or controlling read/write signals. Read/write circuitry may receive an address in an address buffer 302 and convert that address into digital signals that select a particular memory element or set of memory elements in the memory array 308. For example, the address buffer 302 may provide a memory address to a row decoder 306 and/or to a column decoder/MUX 310. These decoders 306, 310 may provide signals to the memory array that address a single memory cell or a plurality of memory cells. The controller 304 may then provide one or more values to be stored in the selected location in the memory array 308 through the read/write circuitry. The controller 304 may be configured to read/write one of a plurality of different value levels to a memory cell. As described above, a memory element may be configured to store more than the traditional 0/1 memory states. For example, some memory elements may have a memory state space that is divided into 64 different discrete value levels, allowing a 6-bit number to be stored in a single memory element.

The row decoder 306, column decoder 310, may also receive commands from the controller 304 to provide specific biases to the memory array 308. For example, instead of simply providing address to the row decoder 306 and/or the column decoder 310, the controller 304 may cause specific voltages to be applied to gate lines, drive lines, and source lines in a memory array that uses transistors as select devices. The voltage control 312 may be configured to provide specific voltages, such as 2.0 V, 0.0 V, and/or voltage ranges, such as 0.6 V-1.3 V to gates, sources, and/or drains of the select transistors and/or electrodes of the individual memory elements. As described in detail below, these biases may be applied to individual cells, individual rows and/or individual columns in the memory array 308 in order to reverse or preemptively compensate for BTI effects in the transistor oxides or other components in the memory cells.

The controller 304 may be implemented using many different types of electronic hardware. For example in some embodiments, the controller 304 may be implemented using digital logic gates, such as flip-flops, transistors, timers, pulse generators, clock signals, and so forth. In other embodiments, the controller 304 may be implemented using a microcontroller, microprocessor, field programmable gate array (FPGA), programmable logic device (PLD), or other programmable circuit. In some embodiments, a computer or server may provide commands to the controller 304 by executing instructions stored on a non-transitory, computer-readable medium or other memory device. The controller 304 may include additional circuitry, such as memories, counters 320, buffers, and so forth. For example, the counter (s) 320 may store a number of times a particular bias has been provided to a particular memory cell in the memory array 308. The counter(s) 320 may also store an amount of time that a particular bias has been provided to a particular memory cell. In some embodiments, counter(s) 320 may be associated with each individual memory cell, each memory column, each memory row, and so forth, in the memory array 308.

Figure 4A:
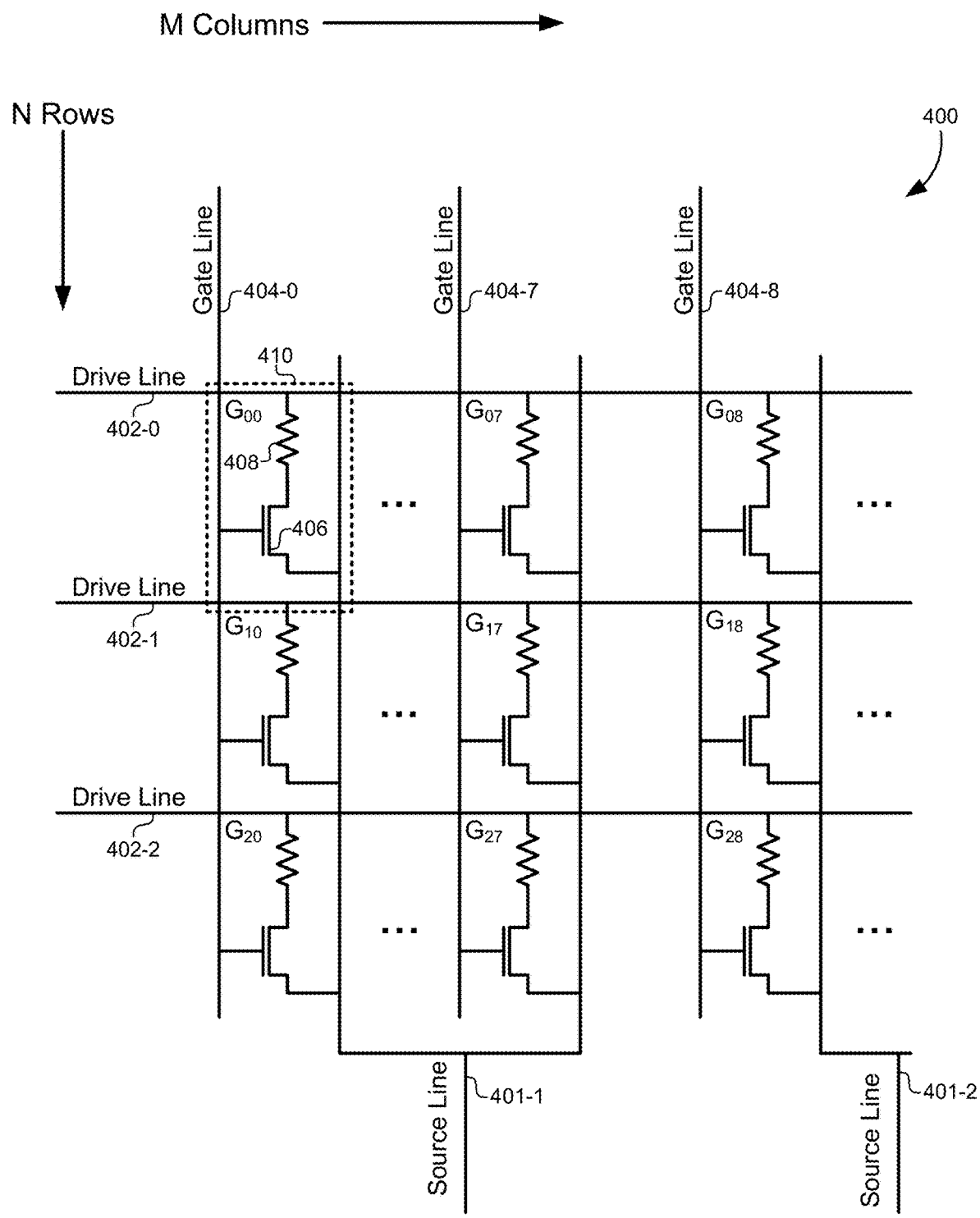
FIG. 4A illustrates a portion of a memory array, according to some embodiments.

FIG. 4A illustrates a portion of a memory array 400, according to some embodiments. This portion of the memory array 400 illustrates three rows and three columns. However, it should be understood that the memory array 400 may be much larger, and may have N rows and M columns, where N and M are integer values greater than three. For example, the memory array 400 may include sizes such as 128×128, with 16 groups of eight columns tied together at the source line nodes. The visible portion of the memory array 400 is shown in FIG. 4A in isolation for the sake of clarity and to illustrate operations that may be carried out on individual memory cells. Therefore, the arrangement and size of the memory array 400 is provided only by way of example and is not meant to be limiting.

The memory array 400 may include a plurality of memory cells, such as memory cell 410. Each memory cell in the plurality of memory cells may include a select element and a memory element. The select element may allow current to flow through the memory element when corresponding signals are provided on a drive line 402, a gate line 404, and/or a source line 401. In this example, the select element may implemented using a MOS transistor 406. The memory element may be implemented using a resistive memory element 408 (e.g. a ReRAM device). However, other embodiments may use different devices to implement the select element and/or the memory element. For example, other embodiments may implement the memory element using a PCM device, a RRAM device, and/or the like, and other embodiments may implement the select element using multiple transistors. Therefore, the specific transistor 406 and resistive memory element 408 are provided only by way of example and are not meant to be limiting.

In this example, the source lines 401 may be connected to the source of the transistors in each column, including transistor 406. Some embodiments may tie the source lines 401 together as illustrated in FIG. 4A. In addition to the source lines 401, gate lines 404 may be tied to the gates of the transistors to control the gate voltage and cause the transistors to conduct. Drive lines 402 may be connected to a first electrode of the memory element, such as the resistive memory element 408. The second electrode of the memory element may be connected to the drains of the transistors. The drive lines 402 may cross the memory array 400 horizontally as illustrated in FIG. 4A.

Figure 4B:
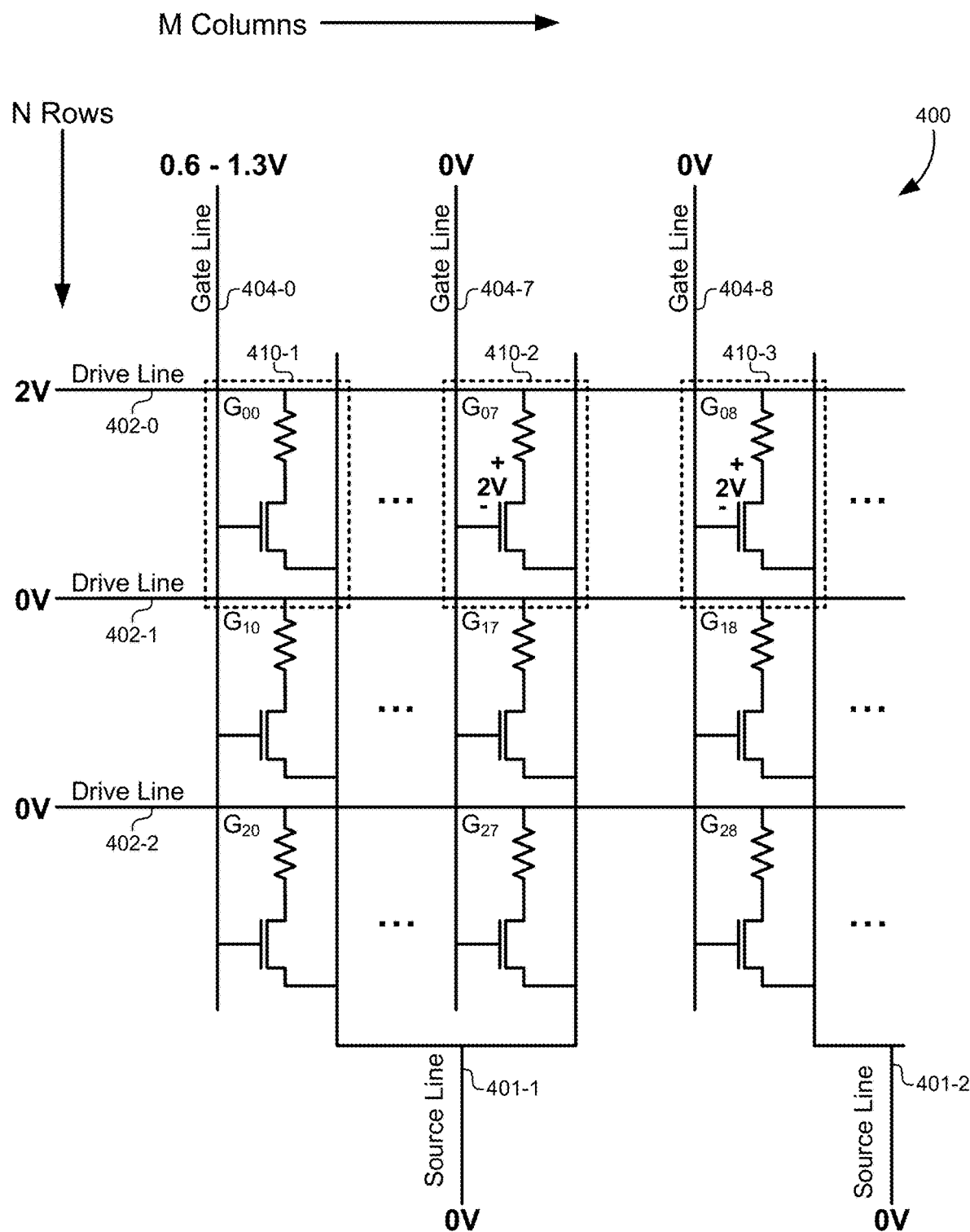
FIG. 4B illustrates how a set operation may be applied to the memory array, according to some embodiments.

FIG. 4B illustrates how a set operation may be applied to the memory array 400, according to some embodiments. The normal operations of the memory array 400 may include set operations, reset operations, and/or operations that set the value of individual memory elements to one of a plurality of intermediate values as described above. These normal write operations may be executed by a controller that applies biases to the gate lines 404, drive lines 402, and/or source lines 401 of the memory array 400. Note that in some memory arrays applying the bias for a set operation may include controlling different types of electrical signals, such as applied voltages, applied currents, and so forth. Typically, a single memory cell may be selected in the memory array 400 by applying a predetermined bias comprising different voltages to corresponding drive line and/or gate line to select the memory cell. It is also possible, in some embodiments, to select multiple cells and apply voltages or currents in parallel to these multiple cells.

The example of FIG. 4B applies biases for a set operation by applying voltages to the gate lines 404, drive lines 402, and/or source lines 401. The specific voltages used as the biases in this example are provided only by way of example and are not meant to be limiting. Other embodiments may use memory elements and/or select elements that respond to different voltage ranges or that are activated using different types of electrical signals, such as bias currents rather than voltages.

In this example, a single memory cell may be selected and programmed by applying a positive voltage on the corresponding drive line and corresponding gate line. In the example of FIG. 4B, memory cell 410-1 may be selected by applying a positive voltage on the corresponding drive line 402-0 and applying a positive voltage to the corresponding gate line 404-0. The voltage on the gate line 404-0 may be less than the voltage on the drive line 402-0. By way of example the voltage on the drive line 402-0 may be approximately 2.0 V, and the voltage on the gate line 404-0 may be approximately between 0.6 V-1.3 V. The corresponding source line 401-1 may be held at a reference voltage, such as 0.0 V. This operation may store a "set" value in the memory element of memory cell 410-1. To distinguish these biases that are applied for the set operation from other biases that are used to reverse the effects of BTI, these set biases may be collectively referred to herein as "first" biases. Thus, the term first biases may encompass any voltages, currents, or other electrical conditions that are applied to a memory array to perform a set operation. As described below, the first biases may also encompass electrical conditions that are applied to the memory array to perform a reset operation and/or operations that set the memory element to an intermediate value.

In addition to storing a value in the memory element, the first biases applied to the gate lines 404, drive lines 402, and/or source lines 401 may also stress the remaining select elements of the memory cells in the same row as the selected memory cell 410-1. For example, when memory cell 410-1 is selected and programmed by applying a positive voltage on its drive line 402-0 and a positive voltage on its gate line 404-0, all of the cells along gate line 404-0 in the same column may have their select element biased with a positive voltage, while all of the cells along drive line 402-0 in the same row may have their select elements biased with a negative voltage. When using transistors as the select elements, this bias results in a negative voltage between the gate of the transistor and the drain of the transistor for all memory cells in the same row as the selected memory cell 410-1. This includes memory cell 410-2, memory cell 410-3, and any other memory cells in this row that are not explicitly shown in FIG. 4B.

Thus, for each set operation performed on a single memory cell, all cells in the same row may be stressed by applying a negative voltage between the gate and the drain of the transistor. In cases where the transistor includes an oxide, the stress caused by these first biases using a negative gate voltage may cause charge carriers to occupy vacancies or interstitials in the oxide. As described above, these trapped charges may cause BTI effects in the transistor to increase. Because each of the transistors in the row is stressed once during each set operation, the BTI effects may continue to build up over time until the accuracy of the calculations performed using the memory array 400 are negatively affected.

In a typical neural network, the values stored in the memory array 400 may all be set during a single set of operations. For example, the memory array 400 may store weights or other scale factors that may be applied to neural network results as part of initializing the neural network. In another example, the memory array 400 may store intermediate results or tensors that result from calculations performed by the neural network. Each of the storage operations may store values in the memory array 400 in a batch operation.

In some embodiments, the controller may include a counter that counts the number of set operations performed on the memory array 400. For example, when all of the values in the memory array 400 are set as part of a batch operation for a set and/or reset, the counter may store a number of times each of the memory cells in the memory array 400 was stressed by negative voltages. For example, some embodiments may simply store the number of set operations performed on the memory array 400. Because each set operation stresses the remaining memory cells in a row, one set operation that sets each of the memory cells in the array may result in (M−1) stress events for each memory cell when the memory array 400 has M columns. Therefore, each single global set operation on the memory array 400 may result in (M−1) instances where the memory cells were stressed with negative voltages, increasing the BTI effects. As described below, second biases may be applied to the memory array 400 to reverse or decrease these BTI effects and release the charges trapped in the oxide of the transistors.

Figure 4C:
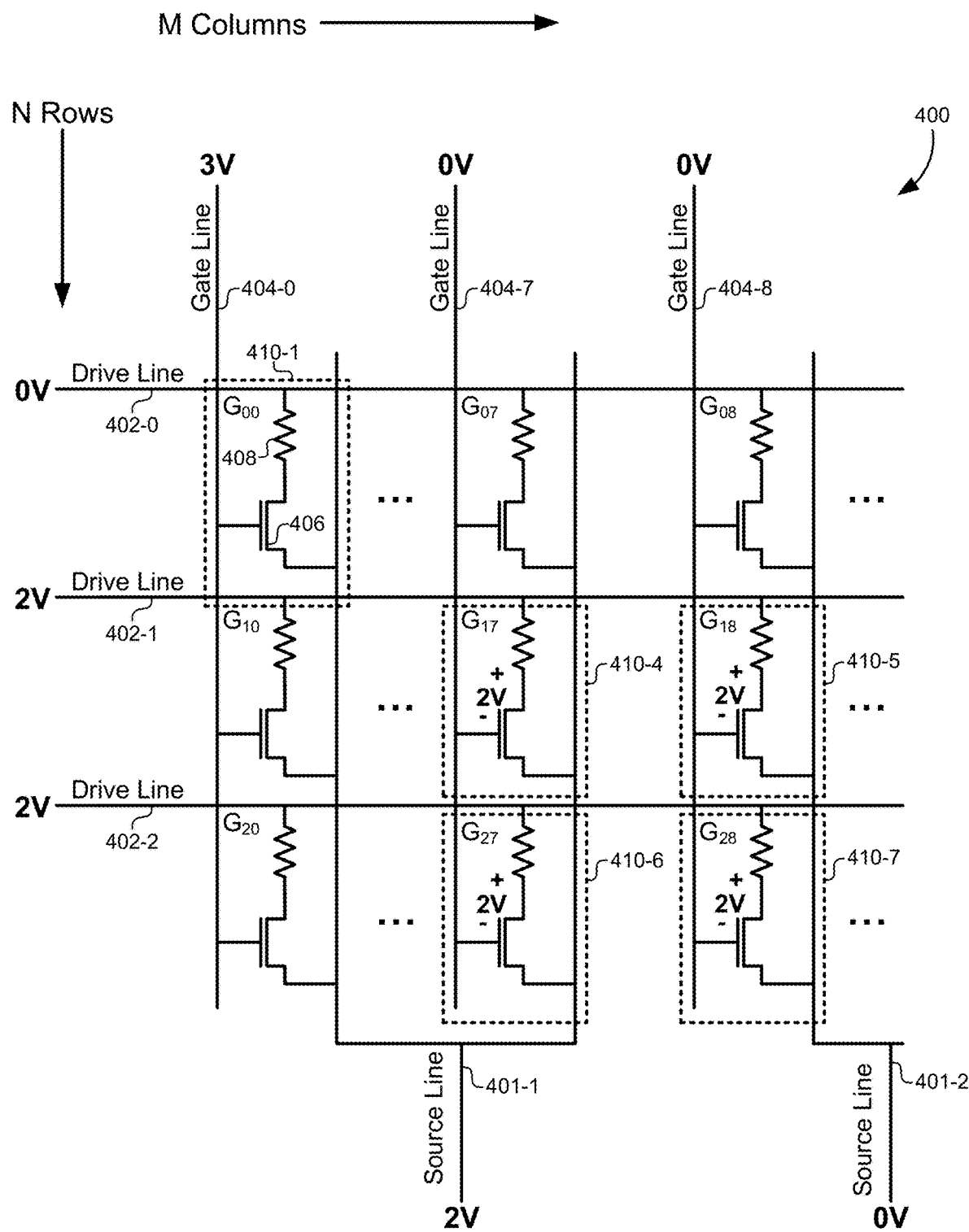
FIG. 4C illustrates how a reset operation may be applied to the memory array, according to some embodiments.

FIG. 4C illustrates how a reset operation may be applied to the memory array 400, according to some embodiments. A reset operation may erase a value stored in a memory cell and/or may increase the resistance of a memory element. A reset operation may be executed by applying a ground voltage to a corresponding drive line and a positive voltage on a corresponding source line. A higher positive voltage may then be applied to the corresponding gate line. For example, to perform a reset operation on memory cell 410-1, a positive voltage may be applied to gate line 404-0 (e.g., 3.0 V), a lesser positive voltage may be applied to source line 401-1 (e.g., 2.0 V), and a reference or ground voltage may be applied to drive line 402-0 (e.g., 0.0 V) in order to prevent other memory cells in the same column from being selected, a positive voltage may be applied to the remaining drive lines. For example, driveline 402-1 and driveline 402-2 may have a positive voltage applied (e.g., 2.0 V).

As illustrated in FIG. 4C, all of the cells along the unselected drive lines may have their corresponding select element biased with a negative voltage. When using a transistor as a select element, this may result in a negative voltage between the gate and drain of the transistor. Thus, for every reset operation performed on a single memory cell each of the cells in the entire memory array 400 except for memory cells in the selected column will be stressed. A memory array having N rows and M columns may be reset as a single batch operation as described above, resulting in each individual memory cell being subjected to (M−1)*(N−1) stress events.

In some embodiments, the controller may also include a counter that records a number of reset events that have been performed on the memory array 400. Some embodiments may also record the time used for each of the set and/or reset events. Assuming a similar set and reset time, the total stress time resulting during the reset may be much longer than the stress during the set operation. Thus, in this and other architectures the stress during the reset operation may be a main contributor to the BTI effects to which the memory array 400 is subjected. Using these counters, the controller may have access to the total amount of time, voltage levels, and number of stress events for each memory cell in the array. These values may be stored for each individual memory cell and/or may be stored for the memory array as a whole.

Figure 4D:
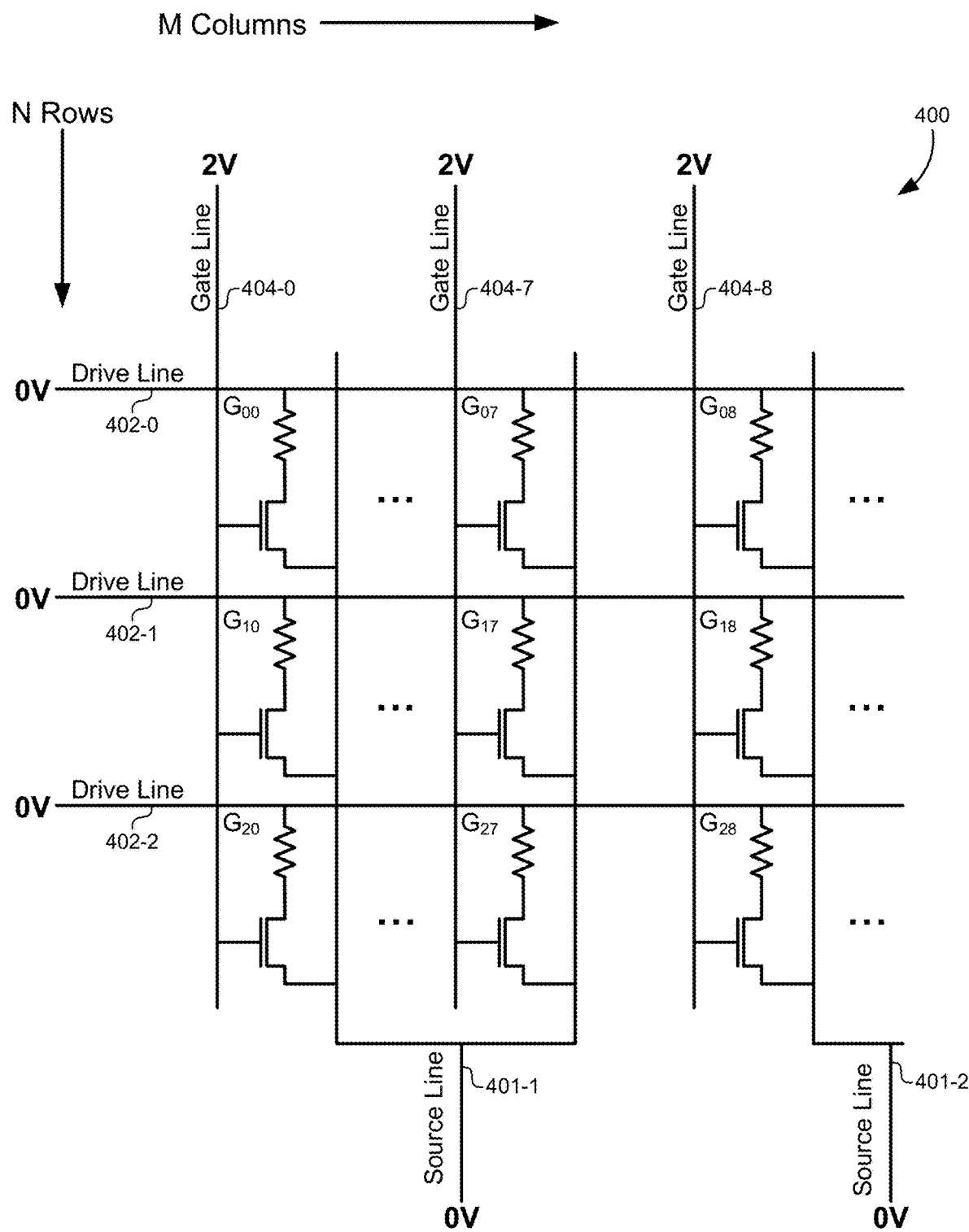
FIG. 4D illustrates how a second set of biases may be applied to the memory array in order to reverse or preempt the effects of the stress events and decrease the BTI effects, according to some embodiments.

FIG. 4D illustrates how a second set of biases may be applied to the memory array in order to reverse or preempt the effects of the stress events and decrease the BTI effects, according to some embodiments. Collectively, the biases that are applied to the various control and select lines for the memory array 400 in this example may be referred to as "second biases" in order to distinguish them from the first biases described above performed during set operations, reset operations, and intermediate value operations. The second biases may include specific voltages or currents that are applied to the control and select lines of the memory array 400. FIG. 4D illustrates an example of particular voltages that may be applied as part of the second biases in order to reverse the BTI effects.

During a BTI compensation operation, gate lines 404 may be held at the reset voltage (e.g., 2.0 V). Source lines 401 and drive lines 402 may be held at a reference or ground voltage (e.g., 0.0) so that no current flows through the memory cells themselves. Consequently, any values stored in the memory element in the memory cells may be maintained during the BTI compensation operation when the second biases are applied. These biases may cause the internal node of each memory cell to be grounded.

Note that these second biases have an opposite polarity in comparison to the first biases. For example, a stress on the drain side of the select transistor that is imposed during the BTI compensation operation may be opposite of the stress on the drain side of the transistor that is imposed during a reset operation. As the opposite gate-drain voltage is applied, this effect has been discovered to reverse the degradation and charge trapping that causes BTI. The second biases thus reverse the BTI effect and return the memory cells to a normal operating state.

Note that the second biases applied in FIG. 4D can be applied simultaneously to all of the memory cells in the memory array 400. The second biases may be applied such that they are equal and opposite of the first biases that cause BTI. For example, after a reset operation of the cells in the memory array 400, the second biases may be applied during a BTI compensation operation as one long pulse that is equivalent in time to (N−1)*(M−1) reset pulses that are applied during a reset operation. In another example, the BTI effects of a set operation may be reversed by applying the second biases as a pulse having a length equivalent in time to (M−1) set pulse lengths. Therefore, the first biases applied as a set or reset operation may all be applied together in a batch. For example, weights in a neural network may be programmed into the memory array 400. This set of one-at-a-time set/reset operations on the memory array 400 may be applied as a global operation that is applied to the memory array 400 as a whole (i.e., a "first" global operation). The second biases may also be applied as a global operation (i.e., a "second" global operation) that affects the memory array 400 as a whole. However, in contrast to the global set/reset operation, the global BTI compensation may be applied to each of the memory cells in the memory array 400 together simultaneously in a single operation instead of being applied one-at-a-time. The second global operation to compensate for BTI may be preemptively applied before the first global operation of set/reset signals, or the second global operation may be applied after the first global operation set/reset signals.

Performing the BTI compensation operation either before or after set and/or reset operations not only reduces the BTI effect on individual cells, but it also improves the operation of the memory array as a whole. For example, BTI compensation improves the endurance of the memory array. Previously, BTI degradation limited the number of set/reset cycles that could be performed using the memory array. The application of BTI compensation operations reduces the BTI effects caused by set/reset operations and increases the number of cycles for which the memory array can be used.

Figure 5:
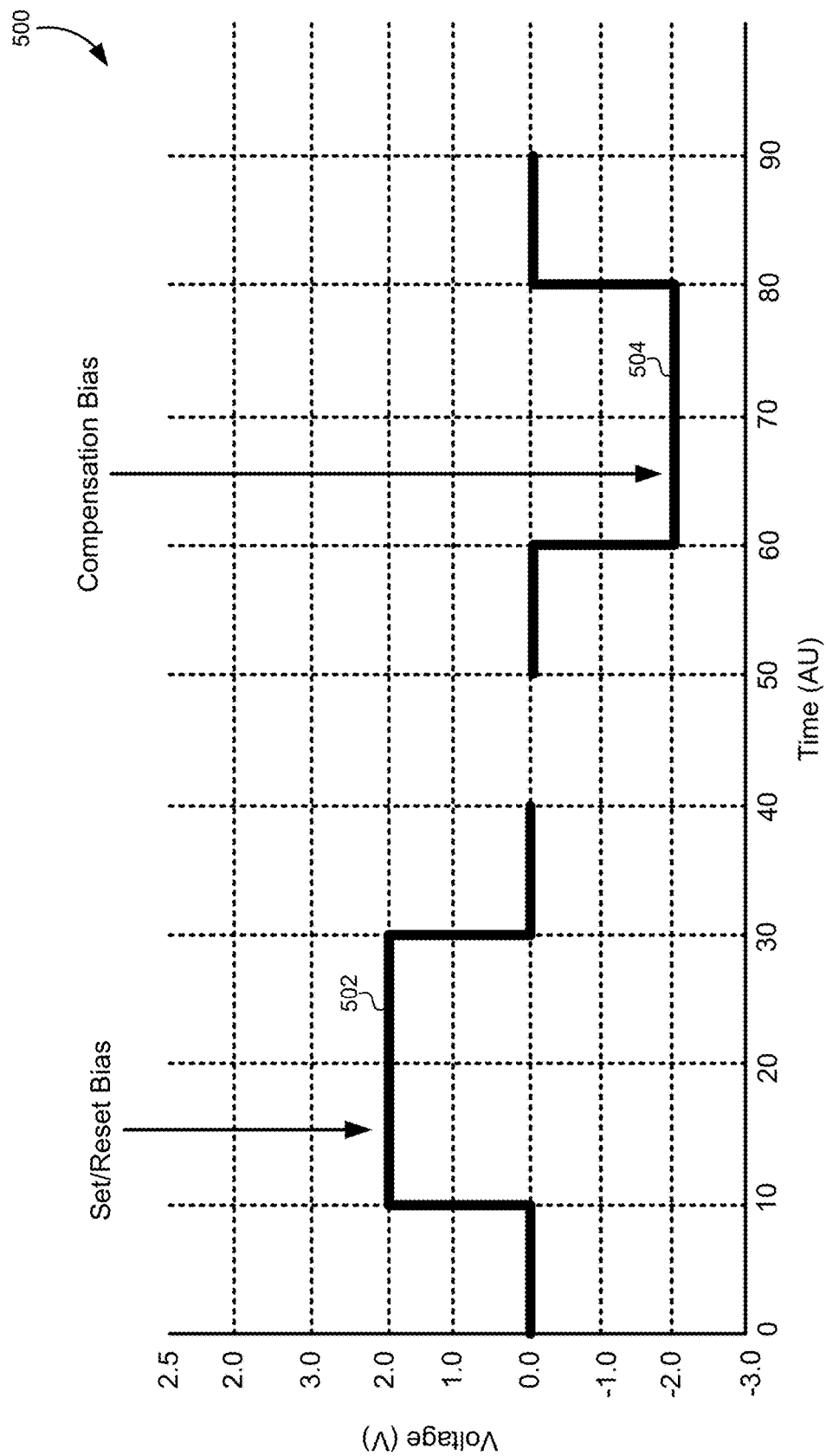
FIG. 5 illustrates a timing diagram of first biases that may cause BTI and second biases that may reverse the effects of BTI, according to some embodiments.

FIG. 5 illustrates a timing diagram 500 of first biases that may cause BTI and second biases that may reverse the effects of BTI, according to some embodiments. A first bias 502 may include applying a positive voltage to the select transistor having a length of approximately 20 units. In order to reverse the effects of this first bias 502, a second bias 504 may be applied as a BTI compensation operation. The second bias 504 may have a polarity that is equal and opposite of the first bias 502. For example, a voltage of −2.0 V may be applied. The length of time during which the first bias 502 is applied may be equal to the length of time during which the second bias 504 is applied.

Figure 6:
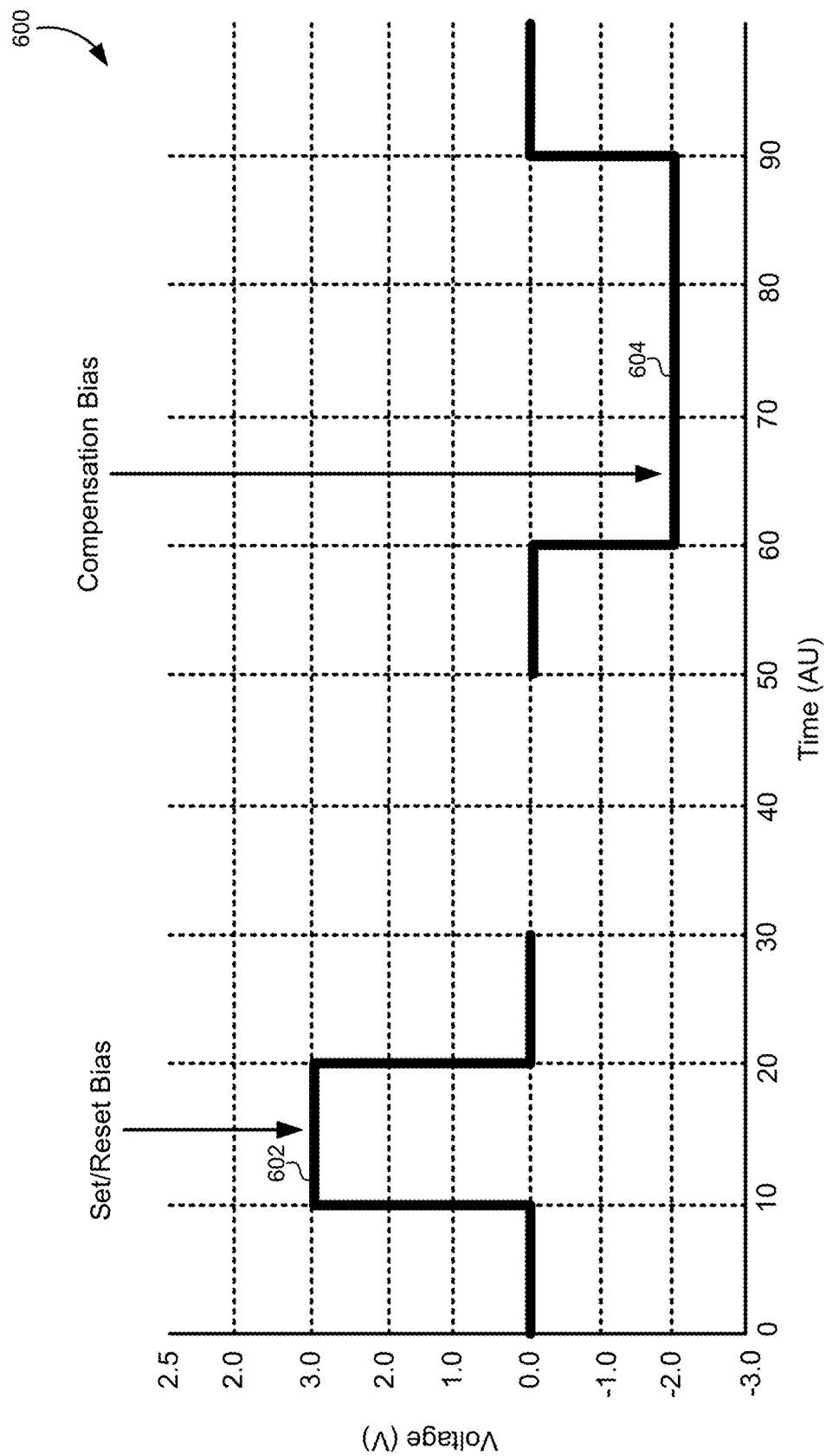
FIG. 6 illustrates a timing diagram where lengths and magnitudes of the second biases may be adjusted, according to some embodiments.

FIG. 6 illustrates a timing diagram 600 where lengths and magnitudes of the second biases may be adjusted, according to some embodiments. If the first bias 602 is applied having a magnitude of approximately 3.0 V for approximately 10 time units, the application of the second bias 604 need not be equal. Instead, a magnitude of the second bias 604 may be decreased (e.g., 2.0 V) while the length of time during which the second bias 604 is applied may be lengthened (e.g., 30 time units). Generally, voltage may be a more critical parameter than time. For example, in some embodiments, increasing the magnitude of the second bias 604 by 10% may correspond to increasing the time by 100% for the second bias 604, showing an exponential relationship between magnitude and time. Conversely, increasing the magnitude of the second bias 604 may allow the time during which the second bias 604 is applied to be greatly reduced. The exact relationship between voltage and time during which the second bias 604 is applied may vary with each memory array architecture. The exponential relationship described above may not hold for every memory array, and thus this relationship between magnitude and time may be measured for each individual memory array architecture where these embodiments may be used.

Figure 7:
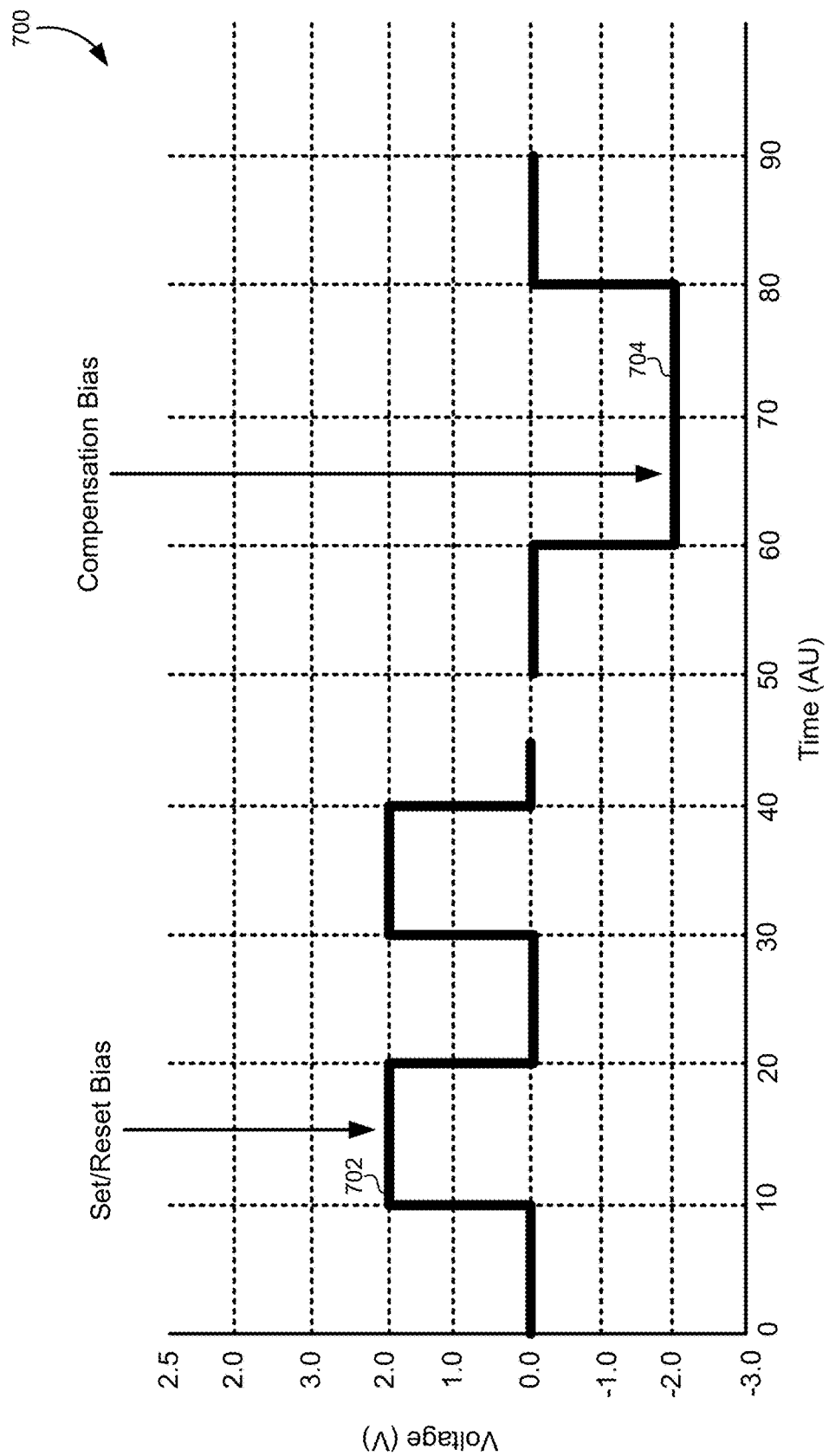
FIG. 7 illustrates a timing diagram of how the BTI effects of multiple set/reset biases can be reversed using a single compensating second bias application, according to some embodiments.

FIG. 7 illustrates a timing diagram 700 of how the BTI effects of multiple set/reset biases can be reversed using a single compensating second bias application, according to some embodiments. As described above, most set/reset operations may include applying a number of different voltage signals to the different control lines of the memory array to individually select each memory cell and perform the set/reset operation. Some embodiments may compensate for a plurality of individual set/reset applications of the first biases using a single application of the second bias. For example, a first bias 702 may be repeatedly applied to the memory array, where each application of the first bias 702 selects a different individual memory cell for a set or reset operation. The total length of time during which the first biases 702 are applied to the memory array may be aggregated. Then, the second bias 704 may be applied for a length of time that equals the total time during which the first bias 702 is applied. As described above, the magnitude of the second bias 704 may be increased and the length of time during which the second bias 704 is applied may be decreased, or vice versa, without restriction.

Figure 8A:
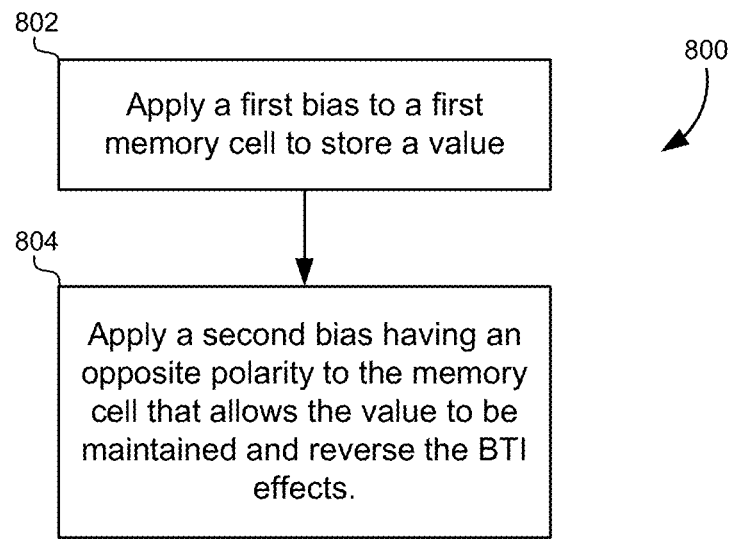
FIG. 8A illustrates a flowchart of a method of correcting bias temperature instability in memory arrays, according to some embodiments.

FIG. 8A illustrates a flowchart 800 of a method of correcting bias temperature instability in memory arrays, according to some embodiments. This method may be executed by the controller 304 in the memory architecture of FIG. 3. This method may also be executed in part by the row/column decoders, and other peripheral circuitry around the memory array itself. Some embodiments may also perform this method using a computer system that sends commands to the memory controller for the memory array. For example, a processor may execute instructions stored on a non-transitory, computer readable medium or memory device to cause the biases described below to be applied to the memory array.

The method may include applying a first bias to a memory cell (802). The first bias may be applied to select a single (second) memory cell in the memory array. This second memory cell may include a memory element and/or a select element. Any of the various memory types and select element types described above may be used with this method. The first bias may cause a value to be stored in the second memory element of the memory cell. For example, the first bias may represent the application of a set operation, a reset operation, or an operation that stores one of a plurality of intermediate states in the second memory element. The application of the first bias to the first/second memory cells may be part of a batch of set/reset operations that iterate through the memory array, individually setting/resetting individual memory cells and applying the first bias to other memory cells in the same row and/or column that are not being set/reset. This may cause one or more stress events to be experienced by non-selected first memory cell in the memory array such that applying the first bias causes BTI associated with the first memory cell to increase. For example, when the first bias is applied to the memory array, the selected second memory cell may store a value, while un-selected first memory cells may experience an increase in BTI or the conditions that cause BTI as a result of the first bias as described above in relation to FIGS. 4A-4D.

The method may also include applying a second bias to the first memory cell (804). The second bias may have an opposite polarity in comparison to the first bias. For example, a gate-drain or gate-source voltage applied during the second bias may be the opposite of a voltage applied during the application of the first bias. The second bias may be applied to individual columns in the memory array as illustrated in FIG. 4D. The second bias may also be applied to every memory cell in the memory array simultaneously. The second bias may be configured such that no current flows through the memory element in each of the memory cells. Thus, the second bias may be configured to leave any values stored in the memory cells unchanged during the application of the second bias. Applying the second bias may reduce BTI effects that were caused by the first bias (or multiple applications of the first bias). For example, the second bias may cause charge carriers to be freed from an oxide lattice in a select transistor. The application of the second bias may have timing and magnitude characteristics such that the BTI effect of the first bias is reversed. Therefore, the time and/or magnitude of the second bias may be determined by a count of a number of times the first bias has been applied to each memory cell. As described in FIGS. 5-7 above, the second bias may increase its magnitude while reducing the time it is applied, and vice versa.

Figure 8B:
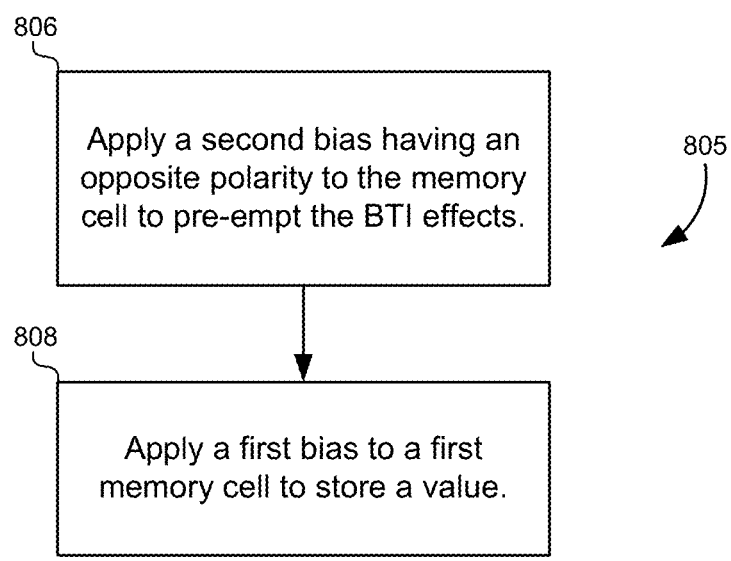
FIG. 8B illustrates a flowchart of an alternative method of correcting bias temperature instability in memory arrays, according to some embodiments.

FIG. 8B illustrates a flowchart 805 of an alternative method of correcting bias temperature instability in memory arrays, according to some embodiments. Specifically, flowchart 805 illustrates how the corrective second bias can be applied preemptively before the application of the first bias. For example, the second bias may be applied (806) prior to a reset operation that may later be applied to each of the memory cells in the memory array. After the preemptive second bias has been applied, the first bias may then be applied to set/reset each of the individual memory cells (808). At the conclusion of the set/reset operation, the BTI effects will be reduced and may be negligible and substantially the same as the BTI effects prior to preemptively applying the second bias. Any claim language reciting these two steps may be performed in any order such that the second bias is applied preemptively prior to a set/reset operation or correctively after the set/reset operation has been executed unless explicitly stated otherwise.

It should be appreciated that the specific steps illustrated in FIGS. 8A-8B provide particular methods of correcting BTI effects in memory arrays according to various embodiments. Other sequences of steps may also be performed according to alternative embodiments. For example, alternative embodiments may perform the steps outlined above in a different order. Moreover, the individual steps illustrated in FIGS. 8A-8B may include multiple sub-steps that may be performed in various sequences as appropriate to the individual step. Furthermore, additional steps may be added or removed depending on the particular applications. Many variations, modifications, and alternatives also fall within the scope of this disclosure.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, Flash Memories, magnetic or optical cards, flash memory, or other types of machine-readable mediums suitable for storing electronic instructions. Alternatively, the methods may be performed by a combination of hardware and software.

What is claimed is:

1. A method of correcting bias temperature instability in memory arrays, the method comprising:
    applying a first bias to a first memory cell in a memory array, wherein the first bias is applied as part of an operation to store a value in a second memory cell in a memory array, wherein the first bias comprises a SET signal, a RESET signal, and/or a signal for one of a plurality of intermediate memory states between a SET state and a RESET state; and
    applying a second bias to the first memory cell, wherein:
        the second bias comprises a polarity that is opposite of the first bias; and
        any value stored in the first memory cell remains in the first memory cell after the second bias is applied.

2. The method of claim 1, wherein:
    a magnitude of the second bias is approximately equal to a magnitude of the first bias; and
    a length of time which the second bias is applied is approximately equal to a length of time which the first bias is applied.

3. The method of claim 1, wherein:
    a magnitude of the second bias is greater than a magnitude of the first bias; and
    a length of time which the second bias is applied is less than a length of time which the first bias is applied.

4. The method of claim 1, wherein:
    a magnitude of the second bias is less than a magnitude of the first bias; and
    a length of time which the second bias is applied is greater than a length of time which the first bias is applied.

5. The method of claim 1, wherein applying the first bias to the first memory cell comprises applying a plurality of voltage pulses to the memory cell.

6. The method of claim 5, wherein applying the second bias to the first memory cell comprises applying a single voltage pulse to the first memory cell, wherein a length of the single voltage pulse is approximately equal to a sum of lengths of the plurality of voltage pulses.

7. The method of claim 1, wherein:
    applying the first bias comprises a SET or a RESET operation for the second memory cell; and
    applying the second bias does not comprise a SET or a RESET operation for the first memory cell or the second memory cell.

8. A memory array comprising:
    a plurality of memory cells, wherein each of the plurality of memory cells comprises a memory element and a select element; and
    a controller configured to:
        apply first biases to memory cells in the plurality of memory cells to store values in the memory cells, wherein the first biases comprises a SET signal, a RESET signal, and/or a signal for one of a plurality of intermediate memory states between a SET state and a RESET state; and
        apply second biases to the memory cells, wherein:
            the second biases comprises a polarity that is opposite of the first biases; and
            the values stored in the memory elements remain in the memory elements after the second biases are applied.

9. The memory array of claim 8, wherein the select element comprises a transistor comprising an oxide, and wherein the first biases cause charge carriers to occupy vacancies in the oxide, thereby causing bias temperature instability (BTI) in the transistor.

10. The memory array of claim 9, wherein the second biases remove the charge carriers from the vacancies in the oxide to correct the BTI in the transistor.

11. The memory array of claim 8, wherein the memory element comprises a resistive random-access memory (RAM) element, a phase-change memory (PCM) element, or a magnetic RAM (MRAM) element.

12. The memory array of claim 8, wherein the select element comprises a plurality of transistors.

13. The memory array of claim 8, wherein at least one of the second biases are applied prior to the first biases being applied to preempt a BTI effect caused by the first biases.

14. The memory array of claim 8, further comprising a counter that counts a number of times the first biases are applied or a length of time the first biases are applied.

15. The memory array of claim 8, wherein the first biases store weights for a neural network into the memory array.

16. The memory array of claim 8, wherein the memory array comprises an N×M memory array, and the first biases comprises SET or RESET operations as a first global operation performed on the memory array.

17. The memory array of claim 16, the second biases are applied as a second global operation on the memory to compensate for BTI effects caused by the one or more executions of the first global operation such that the second global operation sets applies the second biases to each of the memory cells in the memory array together.

18. A method of correcting bias temperature instability in memory arrays, the method comprising:
    applying a first bias to a memory cell, wherein the first bias causes a bias temperature instability (BTI) associated with the memory cell to increase, and wherein the first bias comprises a SET signal, a RESET signal, and/or a signal for one of a plurality of intermediate memory states between a SET state and a RESET state; and
    applying a second bias to the memory cell, wherein the second bias causes the BTI associated with the memory cell to decrease while maintaining any value stored in the memory cell.

* * * * *